United States Patent
Sun (10) Patent No.: US 10,475,986 B1
(45) Date of Patent: Nov. 12, 2019

(54) MAGNETORESISTIVE STACKS AND METHODS THEREFOR

(71) Applicant: Everspin Technologies, Inc., Chandler, AZ (US)

(72) Inventor: Jijun Sun, Chandler, AZ (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 0 days.

(21) Appl. No.: 15/957,333

(22) Filed: Apr. 19, 2018

(51) Int. Cl.
*H01L 43/02* (2006.01)
*H01L 43/10* (2006.01)
*H01L 43/12* (2006.01)
*G11C 11/16* (2006.01)
*H01F 41/32* (2006.01)
*H01F 10/32* (2006.01)

(52) U.S. Cl.
CPC ............ *H01L 43/02* (2013.01); *G11C 11/161* (2013.01); *H01F 10/3259* (2013.01); *H01F 10/3286* (2013.01); *H01F 41/32* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 6,828,260 B2 | 12/2004 | Sharma et al. | |
| 7,635,654 B2 | 12/2009 | Sun et al. | |
| 8,202,572 B2 | 6/2012 | Zhao et al. | |
| 8,686,484 B2 | 4/2014 | Whig et al. | |
| 8,747,680 B1 | 6/2014 | Deshpande et al. | |
| 9,023,216 B2 | 5/2015 | Kochergin et al. | |
| 9,136,464 B1 | 9/2015 | Whig et al. | |
| 9,419,208 B2 | 8/2016 | Whig et al. | |
| 2003/0049389 A1* | 3/2003 | Tsunekawa | B82Y 10/00 427/569 |
| 2004/0041183 A1* | 3/2004 | Slaughter | B82Y 10/00 257/295 |
| 2004/0101978 A1 | 5/2004 | Linn et al. | |
| 2007/0178608 A1 | 8/2007 | Sun et al. | |
| 2015/0236253 A1* | 8/2015 | Whig | H01L 43/12 438/3 |
| 2016/0079089 A1* | 3/2016 | Koezuka | H01L 21/477 438/104 |
| 2016/0284761 A1 | 9/2016 | Zhou et al. | |
| 2016/0315252 A1* | 10/2016 | Pietambaram | H01L 43/08 |

OTHER PUBLICATIONS

International Search Report and Written Opinion issued in International Application No. PCT/US2019/016277, dated May 17, 2019 (14 pages).

\* cited by examiner

*Primary Examiner* — Dung A. Le
(74) *Attorney, Agent, or Firm* — Bookoff McAndrews, PLLC (57) ABSTRACT

A magnetoresistive device includes first and second ferromagnetic regions and an intermediate region formed of a dielectric material between the first and second ferromagnetic regions. A surface of the intermediate region at an interface between the intermediate region and at least one of the first and second ferromagnetic regions may be a plasma treated surface.

15 Claims, 10 Drawing Sheets

MAGNETORESISTIVE STACKS AND METHODS THEREFOR

TECHNICAL FIELD

The present disclosure relates to, among other things, methods for fabricating magnetoresistive stacks and the resulting magnetoresistive stacks.

INTRODUCTION

There are many inventions described and illustrated herein, as well as many aspects and embodiments of those inventions. In one aspect, the present disclosure relates to methods of manufacturing magnetoresistive stacks/structures, the resulting magnetoresistive stacks/structures, and devices using the magnetoresistive stacks/structures. In one embodiment, an exemplary magnetoresistive stack/structure of the present disclosure is used in a magnetic tunnel junction magnetoresistive device (MTJ device), such as, for example, a magnetoresistive memory device, magnetoresistive sensor device, magnetoresistive transducer device, etc.

Briefly, an MTJ device (e.g., a magnetoresistive random access memory (MRAM) device) includes a magnetoresistive memory stack/structure having at least one non-magnetic layer (including, for example, one or more dielectric layers) disposed between a "fixed" magnetic region and a "free" magnetic region, each including one or more layers of ferromagnetic materials. Information is stored in the magnetoresistive stack/structure by switching, programming, and/or controlling the direction of magnetization vectors in the magnetic layer(s) of the "free" magnetic region. The direction of the magnetization vectors of the "free" magnetic region may be switched and/or programmed (for example, through spin transfer torque (STT), spin orbit torque (SOT), or a magnetic field generated by electrical current passing through a nearby conductor) by application of a write signal (e.g., one or more current pulses) through (or adjacent, in the case of spin orbit torque, or above or below, in case of switching of "free" magnetic region by magnetic field generated by electrical current through write lines) to the magnetoresistive memory stack. In contrast, the magnetization vectors in the magnetic layers of a "fixed" magnetic region are magnetically fixed in a predetermined direction. When the magnetization vectors of the "free" magnetic region adjacent to the non-magnetic layer are in the same direction as the magnetization vectors of the "fixed" magnetic region adjacent to the non-magnetic layer, the magnetoresistive memory stack has a first magnetic state. Conversely, when the magnetization vectors of the "free" magnetic region adjacent to the non-magnetic layer are opposite the direction of the magnetization vectors of the "fixed" magnetic region adjacent to the non-magnetic layer, the magnetoresistive memory stack/structure has a second magnetic state. The electrical resistance of the magnetoresistive memory stack/structure (called tunneling resistance) depends on its magnetic state. For example, the first magnetic state may correspond to a state of relatively low(er) electrical resistance and the second magnetic state may correspond to a state of relatively high(er) electrical resistance. The magnetic state of the magnetoresistive memory stack/structure is determined or read based on the resistance of the stack/structure in response to a read current applied through the magnetoresistive stack. Properties such as, for example, magnetoresistance (MR), resistance-area product (RA), delta RA (or change in RA), etc. determine the electrical/magnetic performance of the magnetoresistive memory stack/structure. In some embodiments, the methods of fabricating magnetoresistive stacks/structures described herein provide improvements in at least some of these properties. The scope of the current disclosure, however, is defined by the attached claims, and not by any characteristics of the resulting device or method.

It should be noted that, although exemplary embodiments are described in the context of MTJ stacks/structures, the present inventions may also be implemented in giant magnetoresistive (GMR) stacks/structures where a conductor (e.g., copper) is disposed between two ferromagnetic regions/layers/materials. Indeed, the present inventions may be employed in connection with other types of magnetoresistive stacks/structures wherein such stacks/structures include a "fixed" magnetic region. For the sake of brevity, the discussions and illustrations presented in this disclosure will not be repeated specifically in the context of GMR or other magnetoresistive stacks/structures—but such discussions and illustrations are to be interpreted as being entirely applicable to GMR and other magnetoresistive stacks/structures.

BRIEF DESCRIPTION OF THE DRAWINGS

Embodiments of the present disclosure may be implemented in connection with aspects illustrated in the attached drawings. These drawings show different aspects of the present inventions and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well-defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate that the embodiment(s) is/are "example" embodiment(s). Further, even though the figures and this written disclosure appear to describe the disclosed magnetoresistive stacks in a particular order of construction (e.g., from bottom to top), it is understood that the depicted magnetoresistive stacks/structures may have a different order (e.g., the opposite order (i.e., from top to bottom)). For example, a "fixed" magnetic region may be formed on or above a "free" magnetic region or layer, which in turn may be formed on or above an insertion layer of the present disclosure.

FIGS. 10-12D illustrate experimental results obtained using exemplary magnetoresistive devices according to certain embodiments of the present disclosure;

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range ±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers. That is, a region (as used herein) may include a single layer (deposit, film, coating, etc.) of material or multiple layers of materials stacked one on top of another (i.e., a multi-layer structure). Further, although in the description below, the different regions and/or layers in the disclosed magnetoresistive stacks are referred to by specific names (capping region, reference region, transition region, etc.), this is only for ease of description and not intended as a functional description of the layer. Moreover, although the description below and the figures appear to depict a certain orientation of the layers relative to each other, those of ordinary skill in the art will understand that such descriptions and depictions are only exemplary. For example, though the "free" region is depicted as being "above" an intermediate region, in some aspects the entire magnetoresistive stack may be flipped such that the intermediate region is "above" the "free" region.

In the exemplary embodiments described herein, the disclosed magnetoresistive stacks/structures are described as including an intermediate region made of an electrically insulating or dielectric material positioned (or sandwiched) between two ferromagnetic regions to form a magnetic tunnel junction (MTJ) device or an MTJ-type device. However, as previously explained, in some embodiments, the intermediate region may be a non-magnetic, electrically conductive material (e.g., copper, gold, or alloys thereof), and the magnetoresistive stack may form a giant magnetoresistance (GMR) or GMR-type device. For simplicity, in the discussion below, a magnetoresistive stack/structure is referred to as a magnetorestsitive stack or as an MTJ stack. Of the two ferromagnetic regions disposed on either side of the intermediate region in an MTJ stack, one ferromagnetic region may be a magnetically "fixed" (or pinned) region, and the other ferromagnetic region may be a magnetically "free" region. The term "free" is intended to refer to ferromagnetic regions having a magnetic moment that may shift or move significantly in response to applied magnetic fields or spin-polarized currents used to switch the magnetic moment vector of the "free" region. On the other hand, the words "fixed" and "pinned" are used to refer to ferromagnetic regions having a magnetic moment vector that does not move substantially in response to such applied magnetic fields or spin-polarized currents. For the sake of simplicity, in the discussion below, the magnetically "fixed" region of an MTJ stack is simply referred to as the fixed region, and the magnetically "free" region is simply referred to as the free region.

Figure 1:
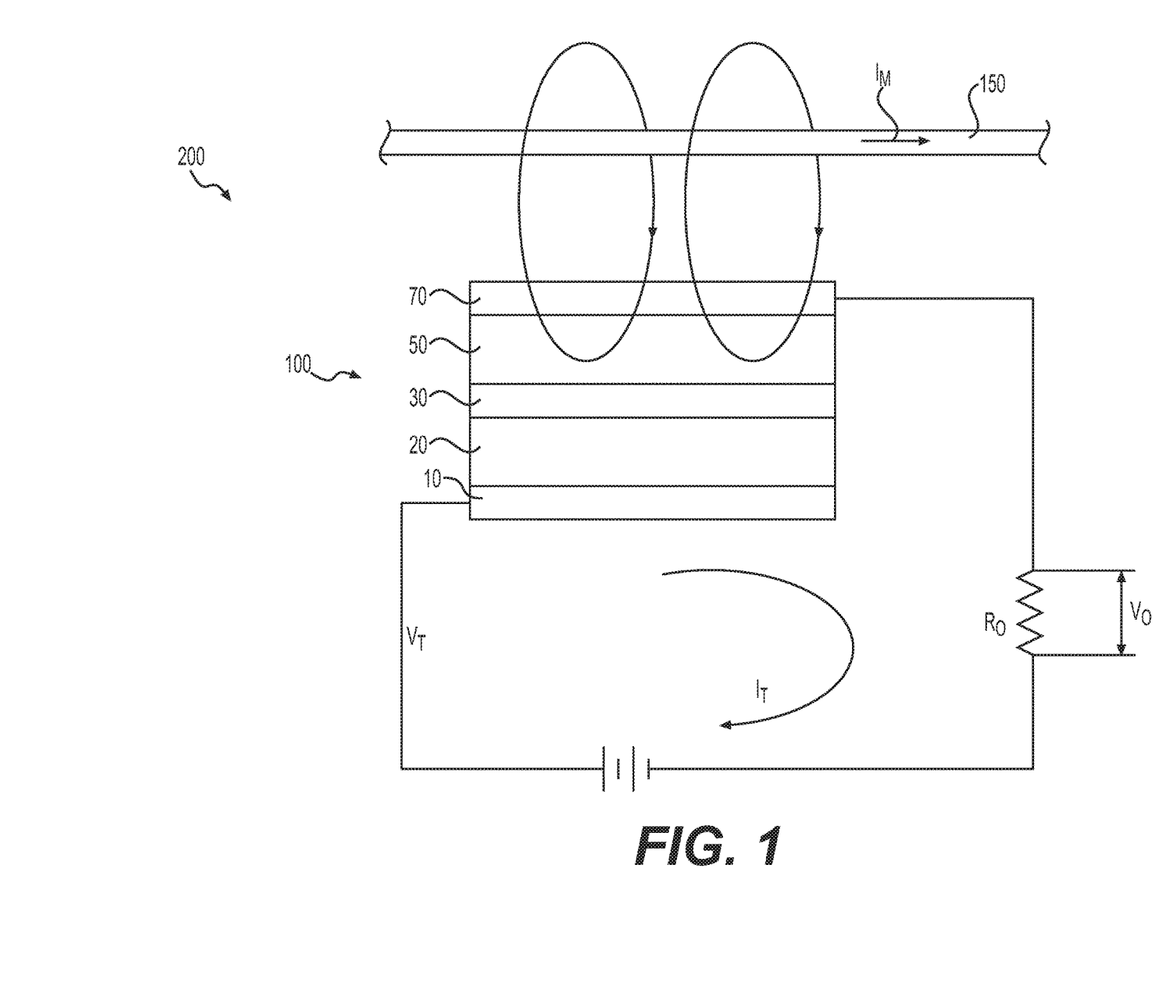
FIG. 1 is a simplified schematic diagram of the electrical circuit of an exemplary magnetic tunnel junction type magnetoresistive device having an exemplary magnetic tunnel junction bit.

FIG. 1 is a simplified schematic diagram of an electrical circuit for an exemplary MTJ device 200 that includes an exemplary MTJ bit 100 (e.g., a single MTJ stack) and a magnetic field source 150. It should be noted that although only a single MTJ bit 100 is illustrated in FIG. 1, MTJ device 200 may include a plurality of MTJ bits 100 arranged in, e.g., a MRAM array. MTJ bit 100 comprises a fixed region 20 made of a ferromagnetic material separated from a free region 50 made of a ferromagnetic material by an intermediate region 30 made of a dielectric material. The dielectric intermediate region 30 serves as a tunnel barrier layer of MTJ device 200. As illustrated in FIG. 1, fixed region 20, intermediate region 30, and free region 50 form a metal-insulator-metal sandwich structure. In the exemplary embodiment illustrated in FIG. 1, MTJ bit 100 includes a bottom electrode 10 and a top electrode 70 provided on either side of the metal-insulator-metal structure. In some embodiments, one or both of the bottom and top electrodes 10, 70 may be eliminated. A tunneling current $I_T$ can flow through MTJ bit 100 in response to a voltage $V_T$ applied across electrodes 10, 70. A resistor $R_o$ is provided in series with MTJ bit 100 to measure the electrical response ($I_T$) of MTJ bit 100 to applied voltage $V_T$. The ratio $V_T/I_T$ defines the tunneling resistance $R_T$ of MTJ bit 100. Tunneling resistance $R_T$ can have different values depending upon the relative orientation of the magnetization direction of free region 50 with respect to fixed region 20.

In some embodiments, the fixed region 20 may include a pinning region next to, or proximate, bottom electrode 10. For example, when the magnetization direction of free region 50 is parallel to that of fixed region 20, $R_T$ may have a relatively low value $R_{T-Min}$ (minimum tunneling resistance), and when the magnetization direction of free region 50 is anti-parallel to that of fixed region 20, $R_T$ may have a relatively higher value $R_{T-Max}$ (maximum tunneling resistance). The magnetization direction of free region 50 can be changed (e.g., to be parallel or anti-parallel to that of fixed region 20) by, for example, the magnetic field of a current $I_M$ passing through a nearby conductor 150, or through MTJ bit 100.

MTJ device 200 can function as a memory or a sensor by measuring the resistance $R_T$ of its MTJ bit 100. The ratio of the change in resistance $R_T$ of MTJ bit 100 is called magnetoresistance ratio (MR=$(R_{T-Max}-R_{T-Min})/R_{T-Min}$). For increased sensitivity of MTJ device 200 (e.g., a device with a good read signal), a bigger difference between $R_{T-Min}$ and $R_{T-Max}$, and thus a larger MR, is desirable. It is known that a substantially defect-free intermediate region 30 (e.g., tunnel barrier layer) improves the performance of MTJ device 200. At the same time, the process of forming the tunnel barrier layer must be relatively simple and amenable to mass fabrication techniques (e.g., not involve inordinate amounts of time, use standard fabrication equipment/processes, etc.) to lower costs. In MTJ device 200, the occurrence of individual MTJ bits 100 with low MR values (that may indicate a hard or a partial electrical short) may result in low manufacturing yields and thus increased cost.

In general, $R_T$ values of MTJ bits 100 in an MTJ device 200 follow a Gaussian distribution. Hard shorts refer to MTJ bits (e.g., MTJ bit 100 of FIG. 1) whose resistance $R_T$ is much lower than what would be expected from the normal Gaussian distribution of resistances, and whose MR is very low compared to the mean or average values of MR observed for such devices. Partial shorts refer to MTJ bits whose resistance $R_T$ lies outside the normal Gaussian distribution, but which otherwise function normally (e.g., an MTJ bit 100 which can be repeatedly written and erased by change magnetization direction). In this disclosure, a partial short is used to refer to both hard and partial electrical shorts and is defined as: (i) any MTJ bit whose resistance $R_T$ lies below the 6-sigma level of the normal Gaussian distribution of $R_T$ values, or (ii) any MTJ bit whose magnetoresistance ratio (MR) falls below the 6-sigma level of the Gaussian distribution of MRs. Resistance values of individual MTJ bits are usually measured at the wafer probe stage of manufacturing of an MTJ device 200. Partial shorts are a good indicator of insulator integrity of the tunnel barrier layer of an MTJ device. Typically, the better the insulator integrity and uniformity of the tunnel barrier layer (e.g., intermediate region 30) in MTJ device 200, the narrower the resistance ($R_T$) distribution and lower the number of partial shorts of its MTJ bits 100.

Figure 2A:
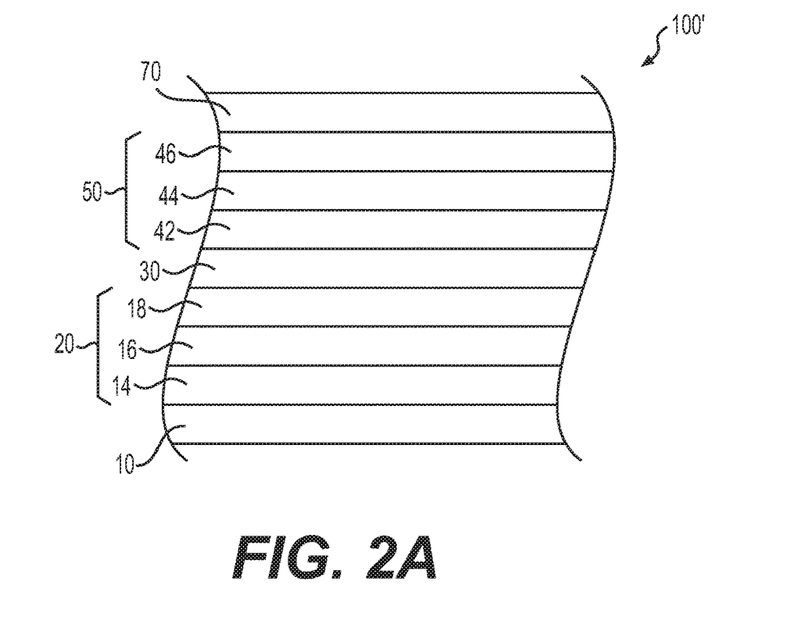
FIGS. 2A-2B illustrate cross-sectional views showing different exemplary stack/structures of the magnetic tunnel junction bit of FIG. 1.

The structure of MTJ bit 100 illustrated in FIG. 1 is only exemplary. In general, MTJ bit 100 can have any suitable structure. FIG. 2A illustrates another exemplary structure of an MTJ bit 100' that may be used in MTJ device 200 of FIG. 1. As illustrated in FIG. 2A, fixed region 20 and free region 50 of MTJ bit 100' may include multiple regions/layers arranged one over the other to form a stack of layers between bottom and top electrodes 10, 70. Although not shown in FIG. 2A, in some embodiments, MTJ stack 100' may be formed between two metal layers (e.g., M1 and M2 metal layers, M2 and M3 metal layers, etc.) of the MTJ device. For example, bottom electrode 10 may be formed on an interconnect structure of a semiconductor substrate (of MTJ device) that is in electrical contact with, for example, CMOS circuitry (e.g., transistors, etc.) on the substrate. Bottom and top electrodes 10, 70 may comprise an electrically conductive material (e.g., tantalum (Ta), titanium (Ti), tungsten (W), or an alloy of these elements (e.g., tantalum-nitride alloy), etc.). In some embodiments, one or both of bottom electrode or top electrode 10, 70 may be eliminated.

In MTJ bit 100' of FIG. 2A, fixed region 20 includes two ferromagnetic regions 14 and 18 separated by an antiferromagnetic coupling region 16. Ferromagnetic regions 14, 18 may include one or more of nickel, iron, cobalt, boron, including their alloys, or engineered materials with one or more of the elements palladium (Pd), platinum (Pt), chromium (Cr), and alloys thereof. Coupling region 16 may include, for example, iridium (Ir), ruthenium (Ru), rhenium (Re), or rhodium (Rh). In some embodiments, one or both regions 14, 18 may include cobalt (Co), iron (Fe), and/or boron (B) in, e.g., an alloy such as CoFeB. Although not shown in FIG. 2A, in some embodiments, fixed region 20 may also include a transition region and/or a reference region disposed on or above region 18 to facilitate/improve the growth of the overlying intermediate region 30. In some embodiments, fixed region 20 also may include one or more non-magnetic material layers, such as, for example, ruthenium, rhodium, platinum, palladium, rhenium, iridium, copper, aluminum, tantalum, titanium, niobium, vanadium, zirconium, iridium, one or more alloys of these elements, and in certain embodiments, tungsten and molybdenum. In some embodiments, fixed region 20 also may include an antiferromagnetic pinning layer including materials such as, for example, a platinum manganese alloy (PtMn), an iridium manganese alloy (IrMn), a platinum palladium manganese alloy (PtPdMn), a nickel manganese alloy (NiMn), etc. Although not a requirement, typically fixed region 20 may have a thickness between approximately 8-300 Å, between approximately 15-110 Å, greater than or equal to 8 Å, greater than or equal to 15 Å, less than or equal to 300 Å, or less than or equal to 110 Å.

Free region 50 may include ferromagnetic regions 42 and 46 separated by an insertion region 44 that provides ferromagnetic or antiferromagnetic coupling between ferromagnetic regions 42, 46. Ferromagnetic regions 42, 46 may include alloys of one or more of nickel, iron, and/or cobalt, and in some embodiments, boron. In some embodiments, regions 42 and 46 may include one or more alloys of cobalt, iron, and boron (CoFeB). Free region 50 also may include an iron rich layer or region disposed between ferromagnetic region 42 and intermediate region 30 and/or between ferromagnetic region 46 and top electrode 70. Insertion region 44 may include any nonmagnetic material, such as, for example, tantalum (Ta), tungsten (W), molybdenum (Mo), ruthenium (Ru), rhodium (Rh), rhenium (Re), iridium (Ir), chromium (Cr), osmium (Os), and their combinations. Although free region 50 of FIG. 2A is illustrated as comprising two ferromagnetic regions 42 and 46 separated by a single insertion region 44, this is only exemplary. In general, free region 50 may have any number of ferromagnetic regions with insertion regions provided between the adjacent ferromagnetic regions. Free region 50 may have any thickness. In some embodiments, free region 50 may have a thickness between approximately 7-130 Å.

Intermediate region 30 may include any dielectric material. In some embodiments, intermediate region 30 may include an oxide material, such as, for example, magnesium oxide $(MgO)_x$ or aluminum oxide $(AlO_x$ (e.g., $Al_2O_3$)). Intermediate region 30 functions as a tunnel barrier in MTJ bit 100'. In general, intermediate region 30 may have any thickness. In some embodiments, intermediate region 30 may have a thickness between approximately 8.5-14.1 Å, preferably between approximately 9.6-13.0 Å, and more preferably between approximately 9.8-12.5 Å. As will be described in more detail below, in some embodiments, intermediate layer 30 and may be formed by depositing a layer of material (such as, for example, magnesium, aluminum, etc.) and then oxidizing the deposited material. In some embodiments, this process may include multiple steps of material deposition and oxidation.

Figure 2B:
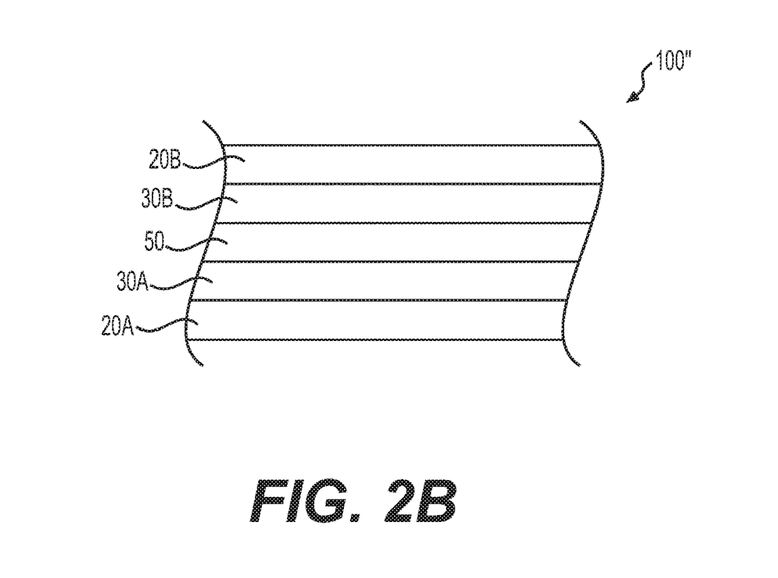

Although FIG. 2A (and FIG. 1) illustrates free region 50 as being formed above fixed region 20, this is not a requirement. In some embodiments, fixed region 20 may be formed above free region 50 (with intermediate region 30 positioned between them). In some embodiments, as illustrated in FIG. 2B, an MTJ bit 100" may have a dual spin filter (DSF) structure where two fixed regions 20A, 20B are positioned on either side of a free region 50 with intermediate regions 30A and 30B positioned between the fixed and free regions. The two fixed regions 20A, 20B and/or free region 50 may have a single-layer or a multi-layer structure (for example, as shown in FIG. 2A). The structures of MTJ bits illustrated in FIGS. 1, 2A, and 2B are only exemplary and an MTJ bit of the current disclosure can have any now-known or future developed stack/structure (including one or more synthetic antiferromagnetic (SAF) structures, synthetic ferromagnetic (SyF) structures, etc.). U.S. Pat. Nos. 8,686,484; 8,747,680; 9,023,216; 9,136,464; and 9,419,208, and U.S. patent application Ser. No. 15/831,736 (filed Dec. 5, 2017); 62/591,945 (filed Nov. 29, 2017); 62/594,229 (filed Dec. 4, 2017); 62/580,612 (filed Nov. 2, 2017); 62/582,502 (filed Nov. 7, 2017), and 62/588,158 (filed Nov. 17, 2017), incorporated by reference in their enterities herein, describe exemplary structures that may be used as MTJ bits of the current disclosure.

It should be noted that, although MTJ bits comprising distinct regions (or regions/layers with distinct interfaces) are illustrated in FIGS. 1, 2A, and 2B, this is only exemplary. As known to one skilled in the art, the interface between adjacent regions of a magnetoresistive stack may, in some cases, be characterized by compositional (e.g., chemical) and/or structural changes due to intermixing between the materials (or intermetallic formation) of the adjacent regions (e.g., during deposition, post deposition anneal, etc.). For example, while the compositional profile across an ideal interface (i.e., an interface which does not undergo compositional changes) between two regions (or layers) may indicate a sharp profile (i.e., the composition abruptly changes from the composition of one region to that of the other region), the compositional profile across a typical interface of the illustrated stacks may indicate a different profile. For example, the profile may indicate a gradual change in chemical composition across an interface of two regions if intermixing occurs between the materials of the regions, or the profile across the interface may indicate the presence of a different composition in the vicinity of the interface if a different interfacial phase (e.g., an intermetallic) is formed at the interface.

Exemplary methods of fabricating selected embodiments of the disclosed MTJ bits (e.g., MTJ bits 100, 100', 100", etc.) will now be described. It should be appreciated that the described methods are merely exemplary. In some embodiments, the methods may include a number of additional or alternative steps, and in some embodiments, one or more of the described steps may be omitted. Any described step may be omitted or modified, or other steps added, as long as the intended functionality of the fabricated magnetoresistive stack/structure remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

Figure 3:
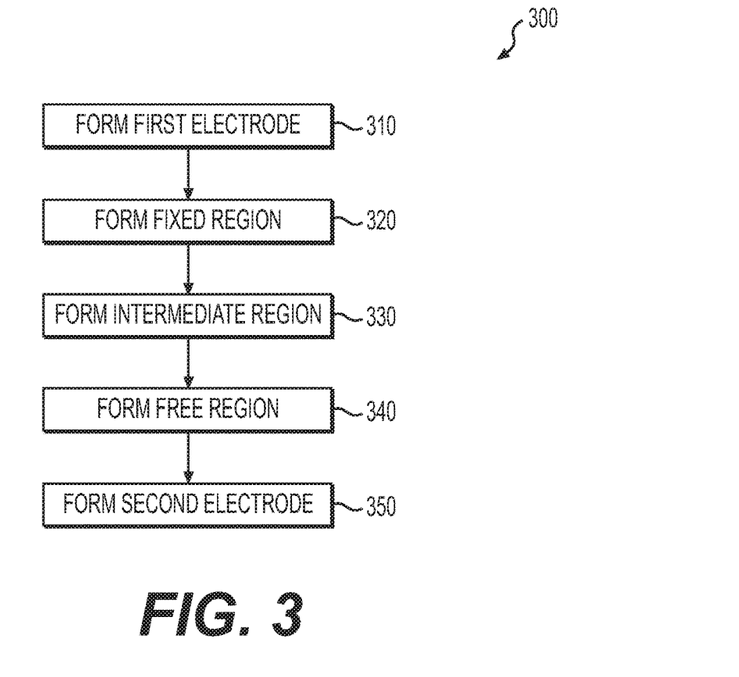
FIG. 3 is a flow chart of an exemplary method of fabricating the magnetic tunnel junction bit of FIG. 1.

FIG. 3 depicts a flow chart of an exemplary method 300 of fabricating MTJ bit 100 (of FIG. 1), according to the present disclosure. In the discussion below, reference will be made to both FIGS. 1 and 2A-2B. A first electrode (e.g., bottom electrode 10) may be first formed on the backend (surface with circuitry) of a semiconductor substrate by any suitable process (step 310). A fixed region 20 then may be formed on or above an exposed surface of electrode 10 (step 320). In embodiments where fixed region 20 is a multi-layer stack that includes multiple stacked regions (e.g., see FIG. 2B), fixed region 20 may be formed by providing (e.g., sequentially) the different regions (e.g., regions 14, 16, and 18 of FIG. 2B) that comprise fixed region 20 on or above the surface of electrode 10. In some embodiments, fixed region 20 also may be formed by providing an antiferromagnetic pinning layer between region 14 and bottom electrode 10. An intermediate region 30 then may be formed on or above an exposed surface of fixed region 20 (step 330). A free region 50 may then be formed on or above the exposed surface of the intermediate region 30 (step 340). In embodiments where free region 50 is a multi-layer stack, free region 50 may be formed by providing (e.g., sequentially providing) the different regions (e.g., regions 42, 44, and 46 of FIG. 2B) that comprise the stack of free region 50. Second electrode 70 may now be formed on an exposed surface of free region 50 (step 350). As those of ordinary skill in the art will readily recognize, method 300 may be appropriately modified to provide for the formation of any additional layers or regions.

Any suitable process may be used to form the different regions of MTJ bit 100. In some embodiments, forming the different regions may include depositing the material of the region by, for example, physical vapor deposition (e.g., ion beam sputtering, magnetron sputtering, etc.), chemical vapor deposition, plasma-enhanced chemical vapor deposition, etc. Formation of some or all of the regions may also involve known processing steps such as, for example, selective deposition, photolithography processing, etching, annealing, etc., in accordance with any of the various conventional techniques known in the semiconductor industry. In some embodiments, during deposition of the fixed and free regions 20 and 50, a magnetic field may be applied to set a preferred easy magnetic axis of the region (e.g., via induced anisotropy). Similarly, a strong magnetic field applied during the post-deposition high-temperature anneal step may be used to induce a preferred easy axis and a preferred pinning direction for any antiferromagnetically pinned materials or exchange coupled pinning materials. Since these techniques are known to those of ordinary skill in the art, they are not described here in greater detail.

Figure 4:
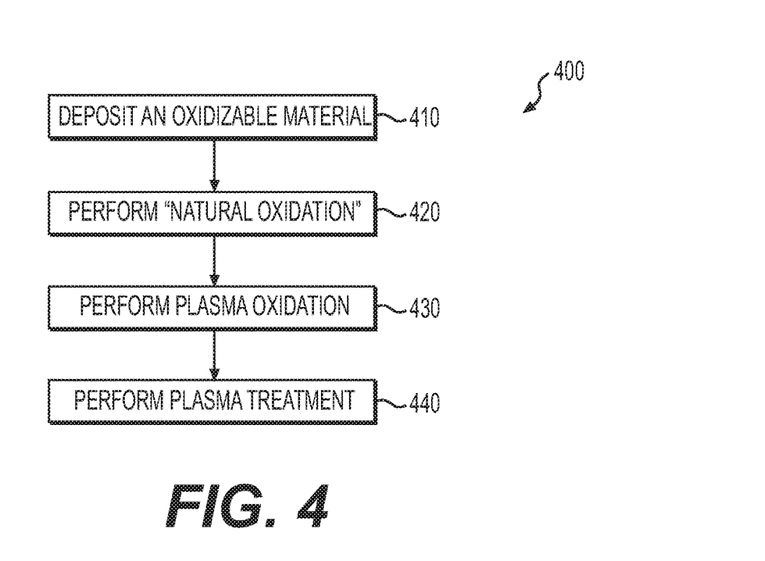
FIG. 4 is a flow chart of an exemplary method of fabricating an intermediate region, including a dielectric material, of the magnetic tunnel junction bit of FIG. 1.

In some embodiments, forming intermediate region 30 (i.e., step 330 of FIG. 3) may include directly depositing an insulating material (e.g., using physical vapor deposition from an oxide target) on a surface of fixed region 20. In some embodiments, forming intermediate region 30 may include deposition of a metallic film or layer followed by oxidation of the deposited film. FIG. 4 illustrates a method 400 of forming intermediate region 30 (i.e., step 330 of FIG. 3) in one exemplary embodiment. A layer of an oxidizable material (for example, magnesium (Mg), aluminum (Al), etc.) is first formed (e.g., deposited) on or above a surface of fixed region 20 (step 410). In some embodiments, in step 410, a physical vapor deposition process (such as, for example, ion beam deposition, molecular beam epitaxy, magnetron sputtering, etc.) may be used to deposit a desired quantity or thickness of magnesium or aluminum. Any thickness of magnesium or aluminum may be deposited. In some embodiments, a layer of magnesium (or another oxidizable material, such as aluminum) having a thickness equal to the desired thickness of intermediate region 30 may be deposited. In some embodiments, a layer of magnesium (or another oxidizable material, such as Al) thinner than the desired thickness of intermediate region 30 may be deposited (to account for an increase in thickness during oxide formation).

The deposited oxidizable material then may be oxidized by "natural oxidation" (step 420). In some embodiments, this "natural oxidation" step (i.e., step 420) may include exposing the deposited material to substantially pure oxygen or a mixture of oxygen with other gases (e.g., 2-80% oxygen in nitrogen), at a pressure of about 0.03-0.05 milli-Torr or less, for about 10-30 seconds, at temperatures less than about 35° C. In some embodiments, "natural oxidation" (i.e., step 420) may involve exposing the deposited material to substantially pure oxygen or a mixture of oxygen with other gases (e.g., 2-80% oxygen in nitrogen), at a relatively higher pressure (e.g., between about 0.15 to 10 milli-Torr) for a relatively longer time (e.g., up to about a few thousand seconds, preferably about 100-2000 seconds), at temperatures less than about 35° C. In general, during "natural oxidation," the deposited material may be exposed to an oxygen containing atmosphere at a pressure between about 0.03-10 milli-Torr at a temperature less than about 35° C. Oxidation at temperatures less than about 35° C. is referred to as low temperature or "natural oxidation" because it resembles (in speed and self-limiting behavior) the oxidation that occurs during exposure to air (e.g., clean-room air) at room temperatures. It should be noted that the natural oxidation of step 420 is typically performed in an enclosed chamber (e.g., an oxidation chamber, deposition chamber, etc.) since oxidizing the deposited material by exposing to clean-room room air may not be a viable option during IC fabrication (for example, to prevent defective devices due to contamination, etc.). Natural oxidation causes the deposited layer to be slowly converted to a relatively dense and pin-hole free oxide (e.g., magnesium oxide (MgO) if Mg is the deposited material). However, the rate of oxidation (or oxidation rate) during natural oxidation is slow and it further decreases with oxide thickness since oxide growth is limited by the rate at which oxygen ions diffuse into the growing oxide film.

Figure 5:
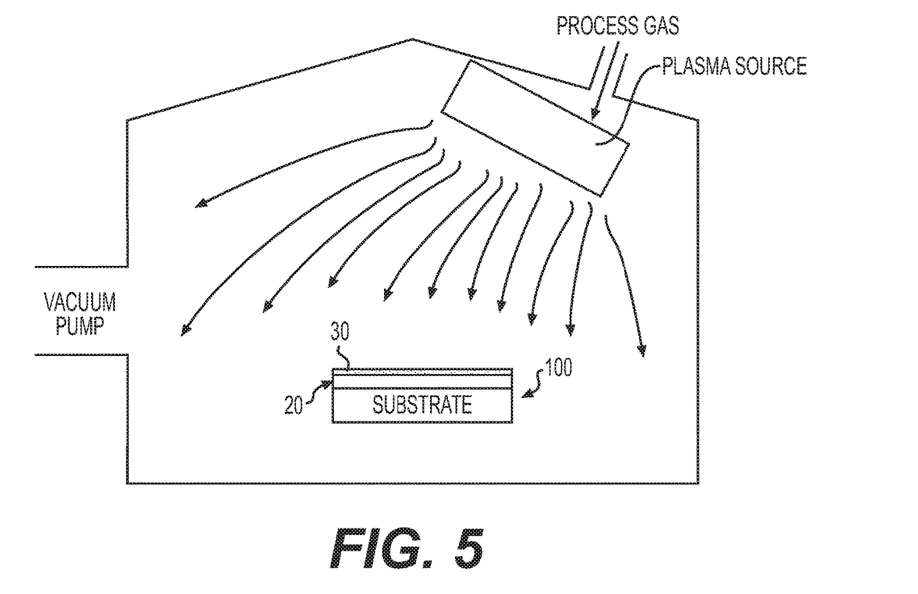
FIG. 5 is a schematic illustration of an exemplary plasma treatment process used during the fabrication of an intermediate region including a dielectric material.

The naturally oxidized layer (i.e., the oxidized material from step 420) is then exposed to plasma oxidation (step 430). FIG. 5 schematically illustrates an exemplary plasma oxidation process. Plasma oxidation may be carried out in an oxidation chamber having an ion beam source that generates plasma. As known to those of ordinary skill in the art, plasma deposition techniques include, such as, for example, ion beam oxidation, remote plasma oxidation, radical or atomic oxidation, substrate RF plasma oxidation, etc. Since plasma oxidation is well known in the art, it is not described in detail herein. Though not a requirement, in some embodiments, plasma oxidation may be carried out by exposing the naturally oxidized layer to a process gas comprising substantially pure oxygen or a mixture of oxygen with other gases (e.g., approximately 2-50% oxygen in nitrogen ($N_2$), argon (Ar), xenon (Xe), krypton (Kr), etc.) at a pressure of about 0.1-50 milli-Torr. In some embodiments, an RF plasma generator operating at about 13.56 Mega-Hertz at about 50-500 Watts (or about 50-200 Watts) may be used to generate the plasma. However, different pressure and generator operating conditions may also be used. During plasma oxidation, the plasma excites the oxygen ions in the process gas so that oxidation of any remaining oxidizable material in the deposited intermediate region 30 (deposited in step 410) occurs at a much faster rate as compared to natural oxidation. This is because the oxygen ions in plasma oxidation (e.g., excited by the plasma) have much higher energy than the oxygen ions in natural oxidation. As a result, these oxygen ions can migrate more rapidly through the growing oxide layer as compared to natural oxidation. In some embodiments, substantially the entire thickness of the deposited layer of oxidizable material (in step 410) may be converted to an oxide after plasma oxidation.

In some embodiments, the oxidation rate of the deposited layer during plasma oxidation (step 430) may be at least about twice (or at least about ten times, or at least about 100 times) the oxidation rate during natural oxidation. A higher oxidation rate is desirable to decrease throughput time. Although plasma oxidation is described as being used in step 430, this is only exemplary. In general, any one of a number of accelerated oxidation techniques can be used. Non-limiting examples of oxidation techniques that may be used in step 430 (instead of or in addition to plasma oxidation) include, but are not limited to, higher temperature thermal oxidation, high pressure oxidation, anodic oxidation, etc.). The applied accelerated oxidation technique may provide the desired rapid oxidation rate without introducing any undesirable contaminants in the resulting intermediate region 30.

Figure 6A:
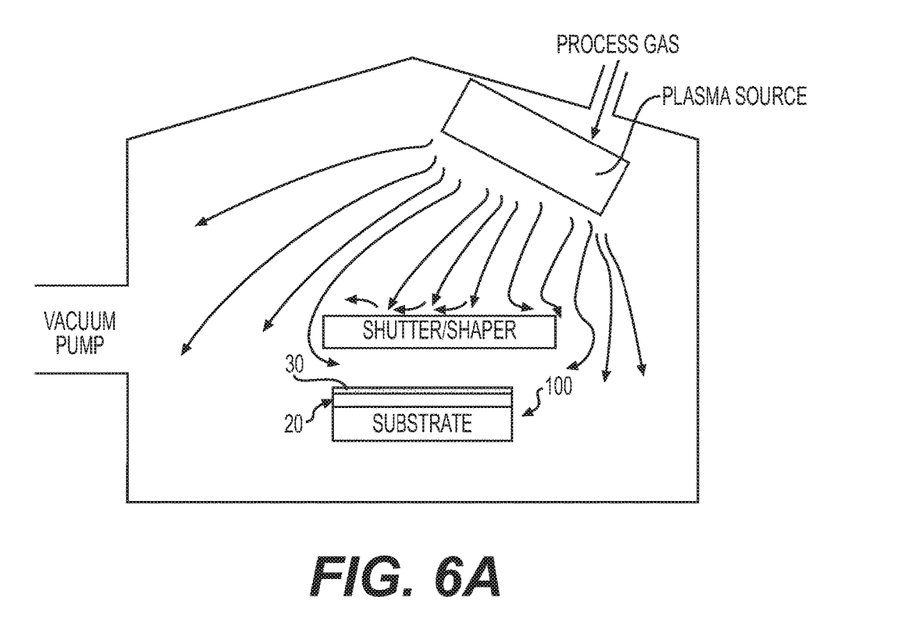
FIG. 6A is a schematic illustration of another exemplary plasma treatment process used during the fabrication of an intermediate region including a dielectric material.

With renewed reference to FIG. 4, the oxidized intermediate region 30 may then be subjected to plasma treatment (step 440). FIG. 6A illustrates an exemplary chamber for performing the plasma treatment of the intermediate region 30 in one embodiment. Although not a requirement, as illustrated in FIG. 6A, in some exemplary embodiments, plasma treatment of intermediate region 30 may be carried out in the same chamber used for plasma oxidation (e.g., an oxidation chamber having an ion beam source that generates plasma) of intermediate region 30. However, during plasma treatment, a shutter or a shaper may be used to block at least a portion of the plasma source so that the surface of intermediate region 30 is only exposed to a reduced amount of plasma, or a gentle plasma. Additionally, in some embodiments, the process gas used for plasma treatment may only have less than or equal to ($\leq$) about half the oxygen content of the process gas used during plasma oxidation and/or natural oxidation. For example, if the process gas used during plasma oxidation (or natural oxidation) includes about 40% oxygen (and the remainder other gases, such as, for example, about 60% $N_2$ and/or Xe, Ar, Kr, etc.), the process gas used for plasma treatment may include less than or equal to about 20% oxygen (and the remainder other gases). In some embodiments, the process gas used during plasma treatment may be substantially free of oxygen. In some embodiments, plasma treatment may be performed at a pressure of about 0.1-10 milli-Torr, preferably 0.5 to 5 milli-Torr. Additionally or alternatively, in some embodiments, the energy level used to generate the plasma during plasma treatment may be less than the energy used to generate the plasma during plasma oxidation. For example in some embodiments, the energy used to generate the plasma during plasma treatment may be $\leq$about 90% (or $\leq$about 75, or $\leq$about 50%) of the energy used to generate the plasma during plasma oxidation. In some embodiments, the energy used to generate the plasma during plasma treatment may be the minimum energy needed to maintain the plasma.

Figure 6B:
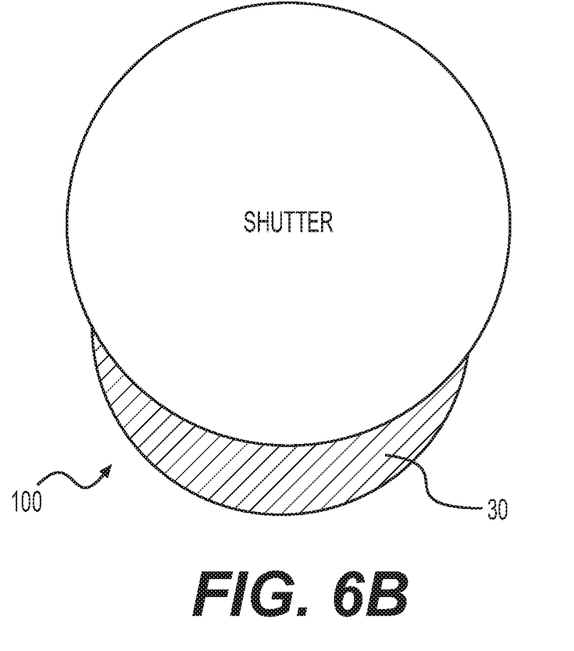
FIGS. 6B-6C are schematic top views of the intermediate region during the process of FIG. 6A, in different exemplary embodiments.
Figure 6C:
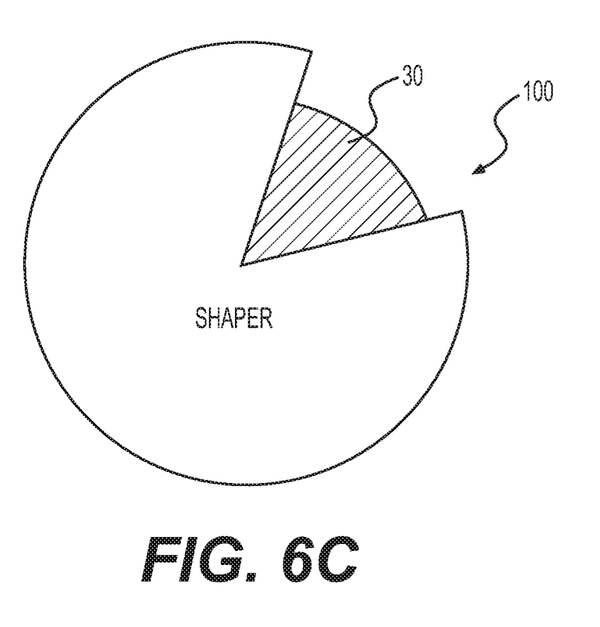

As explained above, a shutter or a shaper may be used to block a portion of the plasma source during plasma treatment. Consequently, only a smaller portion of the plasma generated by the plasma source may interact with the surface of intermediate region 30 as compared to during a plasma oxidation process. As known to those of ordinary skill in the art, a shutter and a shaper are components of oxidation and deposition chambers that are typically used to shield or cover a specimen (such as, for example, MTJ bit 100) from a source (e.g., plasma source, ion source, sputtering target, etc.). FIGS. 6B and 6C are schematic top views illustrating a portion of intermediate region 30 being shielded by a shutter and a shaper, respectively, in exemplary embodiments. As illustrated in FIG. 6B, in some embodiments, the shutter may be positioned between the plasma source and intermediate region 30 such that only a relatively small portion of intermediate region 30 is in the line-of-sight of the plasma source while the substrate with intermediate region 30 is rotated (FIGS. 6B and 6C). Similarly, in some embodiments, the configuration or shape of the shaper may be adjusted such that only a desired portion of the surface area of intermediate region 30 is exposed to the plasma source. In general, the shutter or the shaper may be used to shield any percentage of the surface area of intermediate region 30. Although not a requirement, in some embodiments, greater than or equal to ($\geq$) about 50% (or $\geq$about 70%, or $\geq$about 80%, or $\geq$about 90%) of the surface area of intermediate region 30 may be shielded by a shutter or a shaper. It is also contemplated that, in some embodiments, substantially the entire surface area of intermediate region 30 may be shielded from the plasma source by the shutter or the shaper. It should be noted that, even in embodiments where a substantial portion of intermediate region 30 is shielded from the plasma source by a shutter or a shaper, at least some of the plasma generated by the plasma source will interact with the surface of intermediate region 30 and treat the surface. FIGS. 6A and 6B depict exemplary configurations of a shutter and shaper, respectively. However, those of ordinary skill in the art will recognize that the contemplated shutters and shapers of the present disclosure may have any suitable size, shape, or other configuration.

As a result of the above-described process differences between plasma treatment (step 430 of FIG. 4) and plasma oxidation (step 440 of FIG. 4), the oxidation rate (if any oxidation occurs) during a plasma treatment step may be relatively smaller (substantially smaller in some cases) than the oxidation rate during a plasma oxidation step. In some embodiments, the oxidation rate during a plasma treatment step may be $\leq$about 50% (or $\leq$about 25%, or $\leq$about 10%) of the oxidation rate during plasma oxidation. In general, the duration of a plasma treatment step for intermediate region 30 in step 440 may vary based on the intended application of MTJ bit 100. In some embodiments, plasma treatment of intermediate region 30 may be applied for a time period between about 60 seconds and about 10 minutes. In some embodiments, plasma treatment may be applied for a time period of about 100-900 seconds. In some embodiments, a longer plasma treatment may be preferred without sacrificing too much on throughput or productivity during manufacturing.

Figure 7:
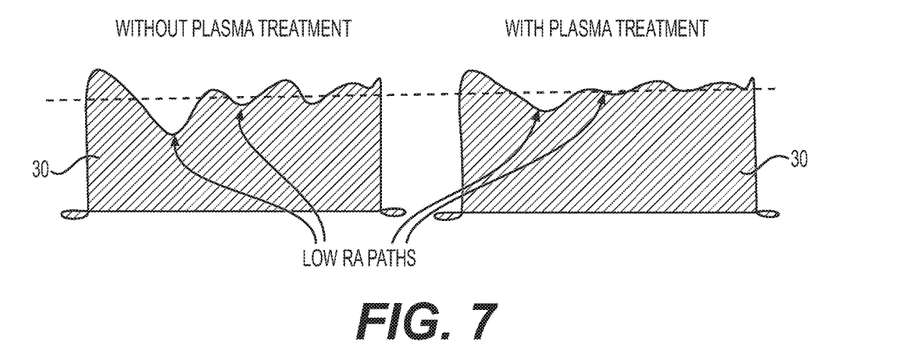
FIG. 7 is a schematic illustration of a surface of an intermediate region, according to the present disclosure, in an exemplary embodiment.

As explained previously, intermediate region 30 functions as the tunnel barrier of MTJ bit 100 (of FIG. 1). It was observed that after plasma treatment, the resistance (e.g., resistance area product or RA) of the tunnel barrier layer increased. It is believed that the observed increase in RA is caused, at least in part, by the plasma treatment modifying the surface of the intermediate region 30 to, among other things, reduce defects and/or weak spots in the tunnel barrier. It is also possible that the plasma treatment removes water vapor, etc. from the surface of intermediate region 30, thereby improving the interface between intermediate region 30 and the overlying free region 50. FIG. 7 schematically illustrates an exemplary surface of intermediate region 30 before and after plasma treatment (i.e., step 440 of FIG. 4). As illustrated in these figures, it is believed that, after plasma treatment, the amount and/or degree of low RA (or short) paths in intermediate region 30 are reduced, resulting in a smoother tunnel barrier layer. As will be explained later, plasma treatment of the intermediate region 30 results in reducing the defects or partial shorts observed in MTJ devices.

Figure 8:
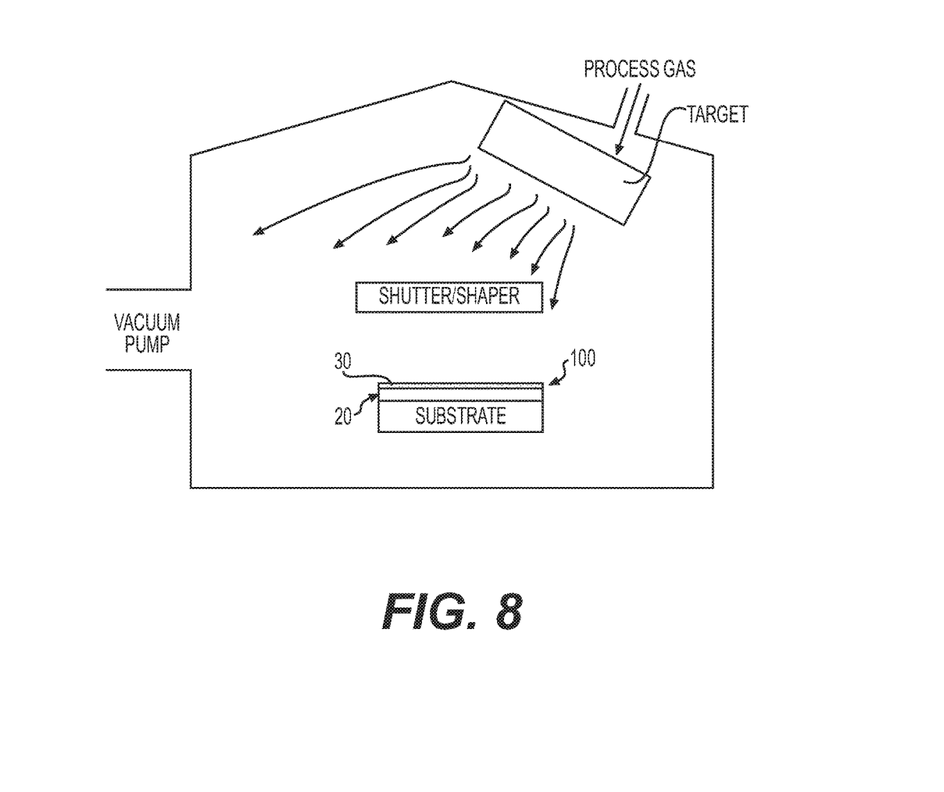
FIG. 8 is a schematic illustration of another exemplary plasma treatment process used during the fabrication of an intermediate region, according to the present disclosure.

Although, in the discussion above, plasma treatment (i.e., step 440 of FIG. 4) was described as being performed in the same equipment (e.g., chamber) used for plasma oxidation of intermediate region 30 (i.e., in an oxidation chamber), this is not a requirement. Plasma treatment of intermediate region 30 may also be performed in other suitable equipment (e.g., a chamber used for sputter deposition, etc.). FIG. 8 illustrates an exemplary embodiment where plasma treatment of intermediate region 30 is performed in a chamber used to sputter deposit material (e.g., oxidizable material(s) of intermediate region 30, a material of the first layer of free region 50, etc.) on a region of MTJ bit 100. As illustrated in FIG. 8, the shutter or shaper is positioned between intermediate region 30 and the sputter target of the deposition chamber to shield the entire intermediate region 30, or a portion of intermediate region 30, from the sputter target. While in this configuration, a reduced amount of plasma (as compared to a case where the shutter/shaper is not thus positioned), or a gentle plasma, interacts with and treats the surface of intermediate region 30.

Figure 9:
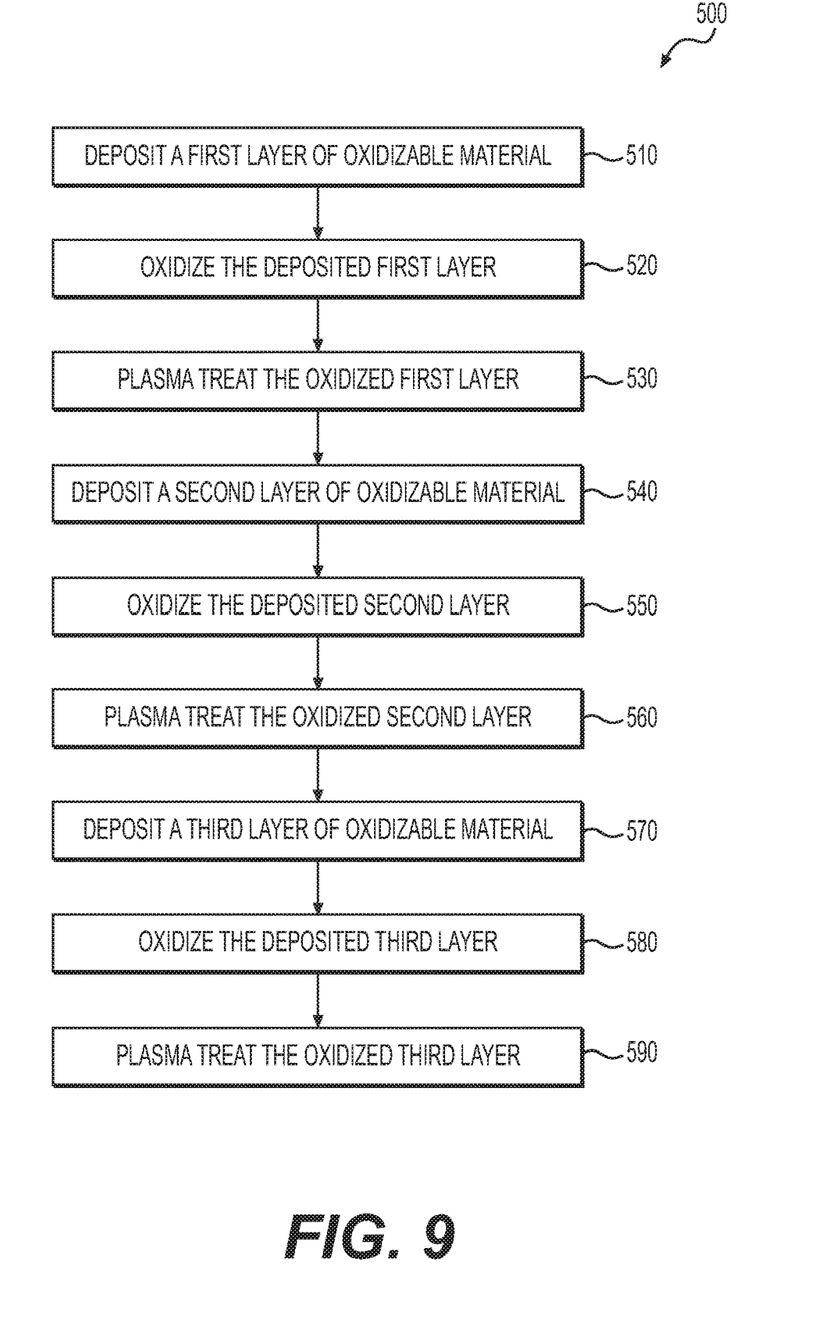
FIG. 9 is a flow chart of another exemplary method of fabricating an intermediate region of the magnetic tunnel junction bit of FIG. 1.

In some embodiments, forming intermediate region 30 (i.e., step 330 of FIG. 3) may involve multiple deposition and oxidation steps. FIG. 9 illustrates another exemplary method 500 of forming intermediate region 30. A first layer of oxidizable material (e.g., magnesium (Mg), aluminum (Al), etc.) is deposited on or over a surface of fixed region 20 (see FIG. 1) (step 510). In general, the deposited layer may have any thickness ($t_1$). In some embodiments, $t_1$ may be about 1-8 Å, or about 2-6 Å, or about 3-5 Å. In some embodiments, $t_1$ may be about 4 Å. The deposited first layer is then oxidized (step 520). In some embodiments, oxidizing the deposited first layer (step 520) may include performing both natural oxidation (i.e., step 420 of FIG. 4) and plasma oxidation (step 430 of FIG. 4) in sequence as described with reference to FIG. 4. In some embodiments, however, only one of natural oxidation or plasma oxidation may be performed in step 520. In some embodiments, the process conditions for natural oxidation and plasma oxidation may be the same as, or substantially similar to, those described previously. In some embodiments, after oxidation, substantially all of, or a significant portion of the deposited first layer may be oxidized (to, e.g., magnesium oxide (MgO) in embodiments where magnesium (Mg) is the deposited oxidizable material). The oxidized first layer then may be plasma treated (step 530) in a manner previously described. A second layer of an oxidizable material then may be deposited on the oxidized first layer (step 540). The deposited second layer then may be oxidized (step 550). Similar to the oxidation of the first layer (in step 520), either one or both of natural oxidation and plasma oxidation may be performed to oxidize the second layer of oxidizable material. The oxidized second layer then may be plasma treated (step 560). A third layer of oxidizable material then may be deposited on the oxidized second layer (step 570), and oxidized using one or both of natural and plasma oxidation (step 580). The oxidized third layer then may be plasma treated (step 590).

Although not a requirement, in some embodiments, the oxidizable material deposited as the first layer, second layer, and third layer (i.e., in steps 510, 540, and 570) may be the same material (e.g., Mg, Al, etc.). Plasma treatment of the oxidized first, second, and third layers (i.e., steps 530, 560, and 590) may be done in a similar manner as that described in step 440 of FIG. 4. In some embodiments, some of these layers may be plasma treated in an oxidation chamber while other layers may be plasma treated in a deposition chamber. For example, in some embodiments, the first and second oxidized layers may be plasma treated (i.e., steps 530 and 560) in an oxidation chamber (see FIG. 6A), while the oxidized third layer may be plasma treated (i.e., step 590) in a sputter deposition chamber (see FIG. 8). For example, prior to sputter depositing free region 50 on intermediate region 30, the shutter or shaper of the sputter deposition chamber may be positioned between the sputter target and intermediate region 30, and the fully covered intermediate region 30 (or in some embodiments, partially covered intermediate region 30) may be treated with plasma from the sputter target. After plasma treatment, the shutter may be moved and free region 50 deposited on or above the plasma treated intermediate region 30 (see step 340 of FIG. 3).

It should be noted that, in some embodiments, some of the above-described steps may be eliminated or modified. For example, although all three deposited layers of the intermediate region 30 are described as being plasma treated (i.e., in steps 530, 560, and 590), this is not a requirement. In some embodiments, only some of these layers may be plasma treated. That is, in some embodiments, one or more steps 530, 560, and 590 may be eliminated. For example, in some embodiments, only the surface of the oxidized third layer is plasma treated (e.g., steps 530 and 560 may be eliminated). By plasma treating one or more layers of the oxidized materials (e.g., dielectric materials), a smoother tunneling barrier may be produced.

Figure 10:
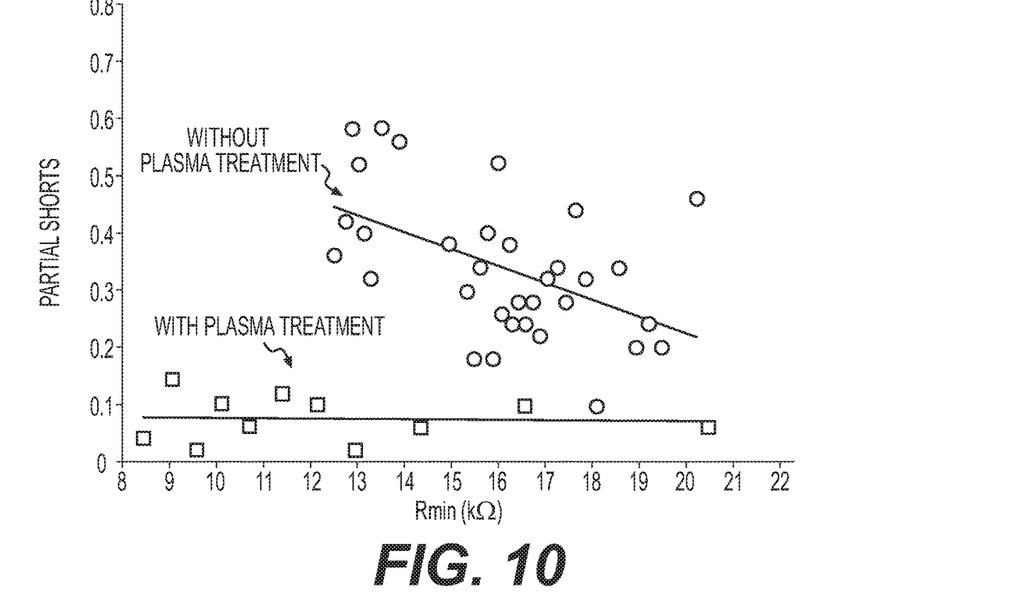

As will be presented below, MTJ devices with tunnel barrier layers that were subjected to the above-described plasma treatment resulted in a lower number of partial shorts (which is an indicator of defects), especially at a lower value of minimum tunneling resistance ($R_{T-Min}$). It is known that low $R_{T-Min}$ usually improves electrical conductance separation between low and high resistance states and hence read performance of MTJ devices. It is expected that MTJ devices with a smoother tunnel barrier (resulting from plasma treatment) will have improved magnetic tunnel junction properties (e.g., breakdown voltage, Time Dependent Dielectric Breakdown (TDDB), MTJ device endurance, etc.). FIG. 10 shows plots of experimental results for MTJ devices having MTJ bits fabricated according to the methods described above. The ordinate of the plot is the average number of partial shorts per MTJ device in a wafer of MTJ devices, and the abscissa is the average value of the observed minimum tunneling resistance ($R_{T-Min}$) for the devices. This data was obtained by probing wafers containing MTJ devices and measuring $R_{T-Min}$ at constant voltage. FIG. 10 plots the observed data for those devices that were subjected to plasma treatment and for those devices that were not subjected to plasma treatment. Based on FIG. 10, it is apparent that MTJ devices where the tunnel barrier layer was plasma treated results in significantly fewer defects (e.g., partial shorts) than those which were not plasma treated.

Figure 11:
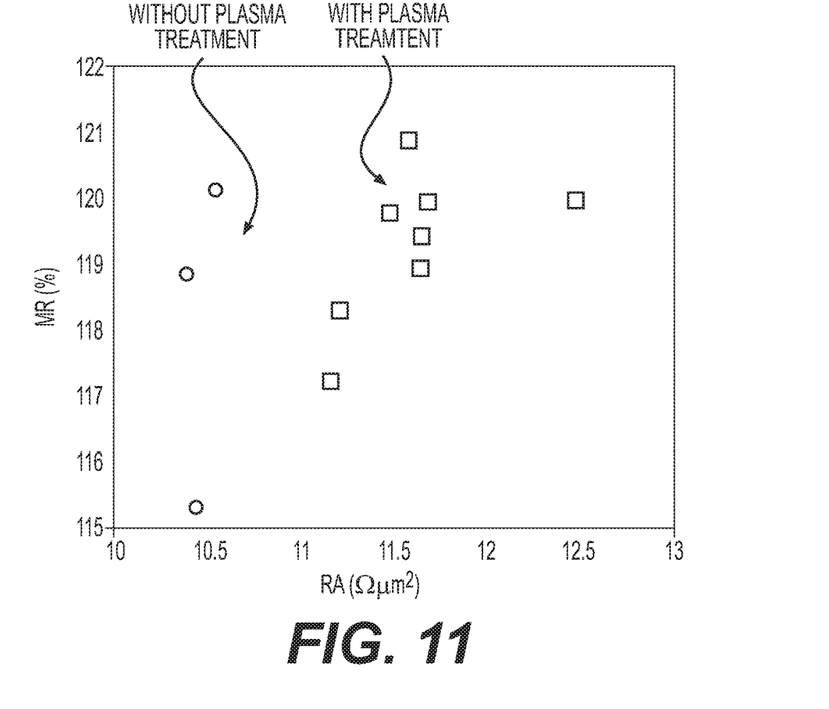
Figure 12A:
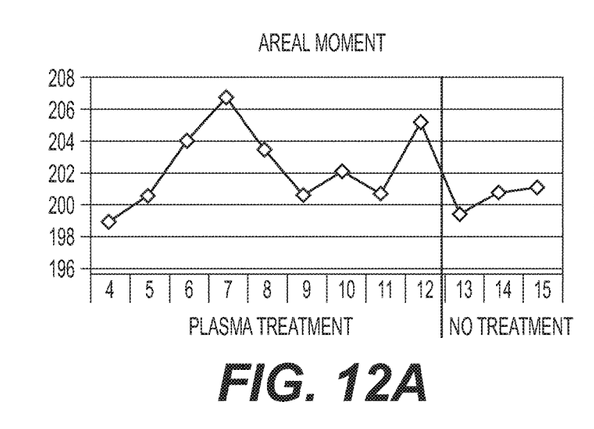
Figure 12B:
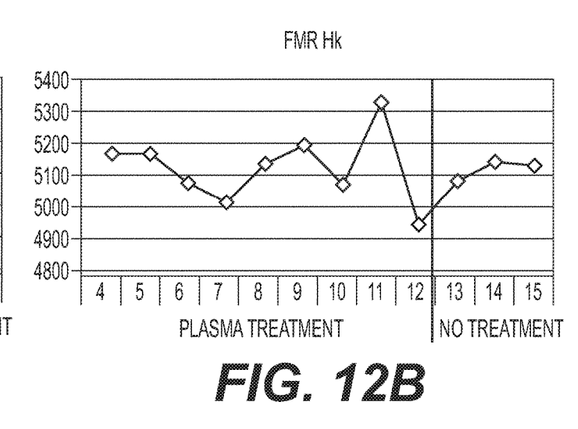
Figure 12C:
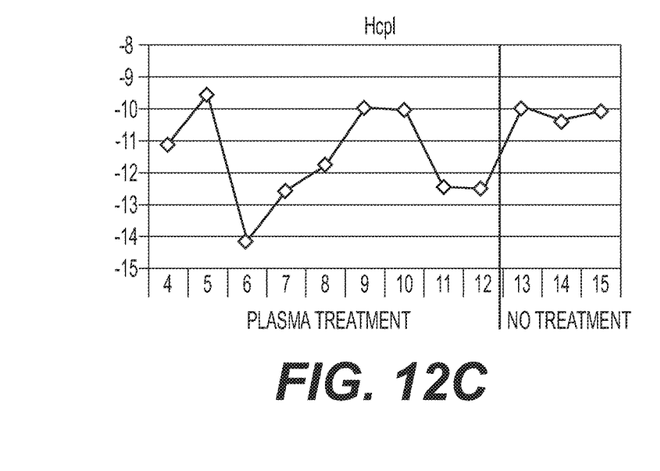
Figure 12D:
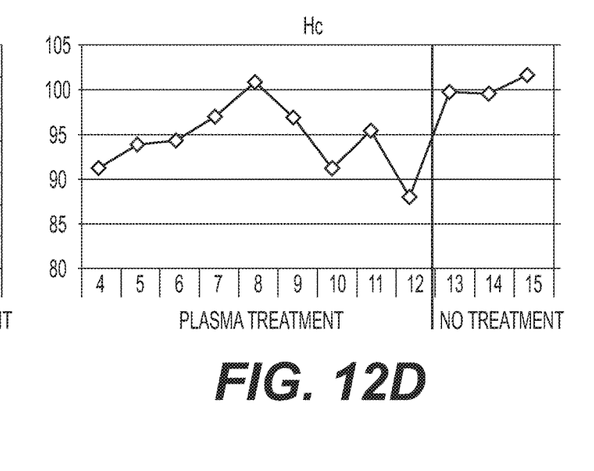

The plot in FIG. 11 compares the magnetoresistance ratio (MR) versus the observed tunneling resistance (RA) for MTJ bits that were subjected to plasma treatment and those that were not subjected to plasma treatment. As can be seen from FIG. 11, plasma treating the tunnel barrier layer increases the tunneling resistance without a change in the magnetoresistance ratio. This increase in the observed tunneling resistance is an indication of the improved tunneling barrier. In some cases, the increase in RA due to plasma treatment may not be observed due to plasma treatment conditions. But the improvement of device properties (such as, e.g., breakdown voltage, endurance, etc.) is still expected. FIGS. 12A-12D compares the effect of plasma treatment on several measured magnetic properties of the free region (e.g., anisotropy field measured by ferromagnetic resonance (FMR), areal moment, magnetic coupling between the free and fixed regions (Hcpl), and coercive force (Hc)) of perpendicular MTJ devices. Comparing the data between the devices that were subjected to plasma treatment with those that were not subjected to plasma treatment indicates that the plasma treatment of the underlying tunnel barrier region did not negatively affect the magnetic properties of the overlying free region.

Although the MTJ devices described above have a bit structure with a single tunnel barrier layer (i.e., a single intermediate region 30 as shown in FIG. 1), similar improvements are expected from embodiments having a dual spin filter structure with two tunnel barrier layers (see FIG. 2B). In some embodiments, a single MTJ (one free region and one fixed region) may include a second intermediate region between free region 50 and top electrode 70 (e.g., intermediate region 30B of FIG. 2B). With reference to FIG. 2B, in some embodiments, the second intermediate region 30B may have smaller RA than the first intermediate region 30A, but may maintain good magnetic properties of free region 50 due to less inter-diffusion between free region 50 and second intermediate region 30B. In case of perpendicular MTJ, the free region 50 interfaced with second intermediate region 30B instead of top electrode region 70 generates perpendicular magnetic anisotropy. In some embodiments, the surface of second intermediate region 30B may be plasma treated (as previously described) prior to deposition of electrode 70. This plasma treatment of second intermediate region 30B is expected to improve the quality of the second intermediate region 30B.

Figure 13:
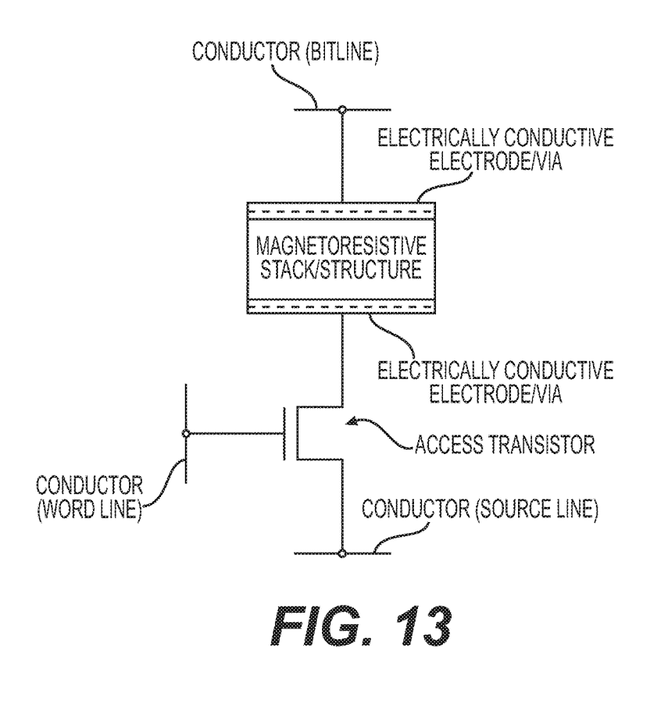
FIG. 13 is a schematic diagram of an exemplary magnetoresistive memory stack/structure electrically connected to an access transistor in a magnetoresistive memory cell configuration.
Figure 14A:
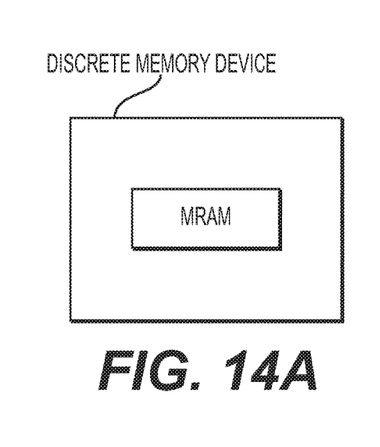
FIGS. 14A-14B are schematic block diagrams of integrated circuits including a discrete memory device and an embedded memory device, each including an MRAM (which, in one embodiment is representative of one or more arrays of MRAM having a plurality of magnetoresistive memory stacks), according to aspects of certain embodiments of the present disclosure.
Figure 14B:
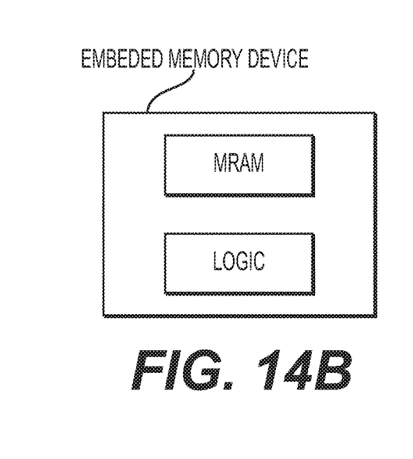

As alluded to above, MTJ bits of the current disclosure may be implemented in a sensor architecture or a memory architecture (among other architectures). For example, in a memory configuration, the MTJ bits may be electrically connected to an access transistor and configured to couple or connect to various conductors, which may carry one or more control signals, as shown in FIG. 13. The MTJ bits of the current disclosure may be used in any suitable application, including, e.g., in a memory configuration. In such instances, the MTJ bits may be formed as an integrated circuit comprising a discrete memory device (e.g., as shown in FIG. 14A) or an embedded memory device having a logic therein (e.g., as shown in FIG. 14B), each including MRAM, which, in one embodiment is representative of one or more arrays of MRAM having a plurality of MTJ bits, according to certain aspects of certain embodiments disclosed herein.

In one or more aspects, the present disclosure is directed to a magnetoresistive device. The device may include a first ferromagnetic region, a second ferromagnetic region, and an intermediate region formed of a dielectric material positioned between the first ferromagnetic region and the second ferromagnetic region. A surface of the intermediate region at an interface between the intermediate region and at least one of the first ferromagnetic region and the second ferromagnetic region may be a plasma treated surface.

In various embodiments the device may include one or more of the following additional aspects: the intermediate region may include one of magnesium oxide or aluminum oxide; the first ferromagnetic region may be a fixed magnetic region of the magnetoresistive device; the first ferromagnetic region may include at least two ferromagnetic layers separated by an antiferromagnetic coupling layer; the first ferromagnetic region may include at least two ferromagnetic layers separated by an antiferromagnetic coupling layer, wherein the second ferromagnetic region may be a free magnetic region of the magnetoresistive device; the first ferromagnetic region may include one or more of iron, cobalt, and boron; the plasma treated surface of the intermediate region may be a surface of the dielectric material that is exposed to a plasma after oxidizing an oxidizable material to form the dielectric material; the dielectric material of the intermediate region may be formed by oxidizing the oxidizable material via plasma oxidation; and the dielectric material of the intermediate region may be formed by oxidizing the oxidizable material via natural oxidation.

In one or more aspects, the present disclosure is directed to a magnetoresistive device. The device may include a first ferromagnetic region, a second ferromagnetic region, and a dielectric region formed between the first ferromagnetic region and the second ferromagnetic region. The dielectric region may include at least one layer of a dielectric material having a plasma treated surface.

In various embodiments the device may include one or more of the following additional aspects: the plasma treated surface may be a surface of the dielectric material that is exposed to a plasma after oxidizing an oxidizable material to form the dielectric material; the dielectric material may be formed by oxidizing the oxidizable material using at least one of plasma oxidation and natural oxidation; the dielectric material may include one of magnesium oxide or aluminum oxide; the first ferromagnetic region may be a fixed magnetic region of the magnetoresistive device; the first ferromagnetic region may be a fixed magnetic region of the magnetoresistive device, and the second ferromagnetic region may be a free magnetic region of the magnetoresistive device.

In one or more aspects, the present disclosure is directed to a method of manufacturing a magnetoresistive device. The method may include forming a first ferromagnetic region, forming an oxidizable region on or above the first ferromagnetic region. The oxidizable region may include at least one layer of an oxidizable material. The method may also include oxidizing the at least one layer of the oxidizable material to form a dielectric material, plasma treating a surface of the dielectric material, and forming a second ferromagnetic region on or above the plasma treated surface.

In various embodiments the device may include one or more of the following additional aspects: the oxidizable material may include one of magnesium or aluminum; the oxidizing may include performing at least one of natural oxidation or plasma oxidation of the oxidizable material to form the dielectric material; plasma treating may include exposing the surface to a plasma in an atmosphere having less than or equal to about half an oxygen concentration as compared to the oxygen concentration during the oxidizing; and plasma treating may include positioning a blocking device to shield at least a portion of the surface from a plasma source.

Although various embodiments of the present disclosure have been illustrated and described in detail, it will be readily apparent to those skilled in the art that various modifications may be made without departing from the present disclosure or from the scope of the appended claims.

What is claimed is:

1. A method of manufacturing a magnetoresistive device, comprising:
    forming a first ferromagnetic region;
    forming an oxidizable region on or above the first ferromagnetic region, wherein the oxidizable region includes at least one layer of an oxidizable material, and wherein the oxidizable material includes one of magnesium or aluminum;
    oxidizing the at least one layer of the oxidizable material to form a dielectric material, wherein the oxidizing includes performing at least one of natural oxidation or plasma oxidation to form the dielectric material;
    plasma treating a surface of the dielectric material, wherein the plasma treating includes exposing the surface to a plasma in an atmosphere having less than or equal to about half an oxygen concentration as compared to the oxygen concentration during the oxidizing; and
    forming a second ferromagnetic region on or above the plasma treated surface.

2. The method of claim 1, wherein plasma treating includes positioning a blocking device to shield at least a portion of the surface from a plasma source.

3. The method of claim 1, wherein plasma treating the surface of the dielectric material includes exposing the surface to a plasma in an atmosphere that is substantially free of oxygen.

4. The method of claim 1, wherein plasma treating the surface of the dielectric material includes exposing the surface to a plasma at a pressure of about 0.1 to 10 milli-Torr.

5. The method of claim 1, wherein plasma treating the surface of the dielectric material includes exposing the surface to a plasma at a pressure of about 0.5 to 5 milli-Torr.

6. The method of claim 1, wherein oxidizing the at least one layer of the oxidizable material includes exposing the at least one layer to an oxygen containing atmosphere at a pressure between about 0.03 to 10 milli-Torr at a temperature less than about 35° C.

7. The method of claim 1, wherein oxidizing the at least one layer of the oxidizable material includes exposing the at least one layer to an oxygen containing atmosphere at a pressure of about 0.03 to 0.05 milli-Torr for about 10-30 seconds at a temperature less than about 35° C.

8. The method of claim 1, wherein oxidizing the at least one layer of the oxidizable material includes exposing the at least one layer to an oxygen containing atmosphere at a pressure of about 0.15 to 10 milli-Torr for about 100-2000 seconds at a temperature less than about 35° C.

9. A method of manufacturing a magnetoresistive device, comprising:
    forming a first ferromagnetic region;
    depositing an oxidizable material on or above the first ferromagnetic region;
    oxidizing the deposited oxidizable material to form a dielectric material;
    after forming the dielectric material, plasma treating a surface of the dielectric material, wherein the plasma treating includes exposing the surface to a plasma in an atmosphere having less than or equal to about half an oxygen concentration as compared to an oxygen concentration during the oxidizing; and
    forming a second ferromagnetic region on the plasma treated surface of the dielectric material.

10. The method of claim 9, wherein the oxidizable material includes one of magnesium or aluminum.

11. The method of claim 9, wherein the oxidizing includes performing at least one of natural oxidation or plasma oxidation of the oxidizable material.

12. The method of claim 9, wherein the plasma treating includes exposing the surface to a plasma at a pressure of about 0.1 to 10 milli-Torr.

13. The method of claim 9, wherein the oxidizing includes exposing the deposited oxidizable material to an oxygen containing atmosphere at a pressure between about 0.03 to 10 milli-Torr at a temperature less than about 35° C.

14. The method of claim 9, wherein the oxidizing includes exposing the deposited oxidizable material to an oxygen containing atmosphere at a pressure of about 0.03 to 0.05 milli-Torr for about 10-30 seconds at a temperature less than about 35° C.

15. The method of claim 9, wherein the oxidizing includes exposing the deposited oxidizable material to an oxygen containing atmosphere at a pressure of about 0.15 to 10 milli-Torr for about 100-2000 seconds at a temperature less than about 35° C.

* * * * *